United States Patent [19]

United States Patent [19]

Tamamura et al.

[11] Patent Number: 4,833,403
[45] Date of Patent: May 23, 1989

[54] METHOD AND APPARATUS FOR MEASURING SETTLING CHARACTERISTICS OF A DEVICE UNDER TEST BY USING A MEASUREMENT SYSTEM FOR MEASURING AN INPUT SIGNAL BY SAMPLING AND DIGITIZING SAID INPUT SIGNAL

[75] Inventors: Toshio Tamamura; Akira Hoshika; Kiyoyasu Hiwada, all of Tokyo, Japan

[73] Assignee: Hewlett-Packard Company, Palo Alto, Calif.

[21] Appl. No.: 104,883

[22] Filed: Oct. 5, 1987

[30] Foreign Application Priority Data

Oct. 8, 1986 [JP] Japan .................. 61-239737

[51] Int. Cl.4 ............................. G01R 1/28
[52] U.S. Cl. ................. 324/158 R; 324/130
[58] Field of Search ............ 324/57 R, 57 N, 57 PS, 324/158 R, 158 D, 158 SC, 158 SY, 158 T, 77 A, 77 R, 78 D, 79 D, 130, 63

[56] References Cited

U.S. PATENT DOCUMENTS

| | | | |
|---|---|---|---|
| 4,253,057 | 2/1981 | Carlton et al. | 324/57 PS |
| 4,547,724 | 10/1985 | Beazley | 324/57 PS |
| 4,607,216 | 8/1986 | Yamaguchi et al. | 324/57 PS X |
| 4,608,657 | 8/1986 | Manome et al. | 324/57 PS X |
| 4,613,814 | 9/1986 | Penney | 324/57 PS X |
| 4,641,246 | 2/1987 | Halbert et al. | 324/77 A X |

OTHER PUBLICATIONS

Beck et al., "Testing Repeaters with Circulated Pulses,", *Proceedings of the Institute of Radio Engineers*, vol. 35, No. 11, Nov. 1947, pp. 122–123.
Andrews et al., "Time Domain Automatic Network Analyzer", *Lamesure Electrique DePrecision*, May 1975, pp. 258–267.
Gaulrapp et al., "Error Injector Tool", *IBM-TDB* vol. 20, No. 8, Jan. 1978, pp. 3286–3287.
Chen et al., "Power Cable Diagnosis Using Cepstrum Processing of Time Domain Reflectometry," *IEEE Power Eng. Soc. Summer Mtg.*, Jul. 1976, pp. 1–4.
Article: "Settling-Time Measurements Demand Precise Test Circuitry", EDN Nov. 16, 1984, by Jim Williams, pp. 307–314.

Primary Examiner—Reinhard J. Eisenzopf
Assistant Examiner—Warren S. Edmonds
Attorney, Agent, or Firm—Patrick J. Barrett

[57] ABSTRACT

A method and an apparatus for measuring settling characteristics of a device under test. A measurement system for measuring an input signal by sampling and digitizing that input signal is employed to obtain reference data by measuring a reference signal, at least one level of which is flat, and to obtain measurement data by measuring a second signal representing the settling characteristics to be measured but containing an error component due to inclusion of the measurement system itself. The error component is removed from the measurement data by adjusting the timing and level of the reference data relative to those of the measurement data.

15 Claims, 3 Drawing Sheets

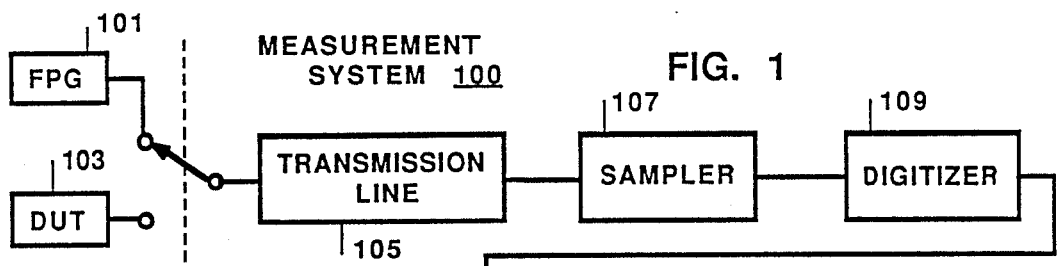
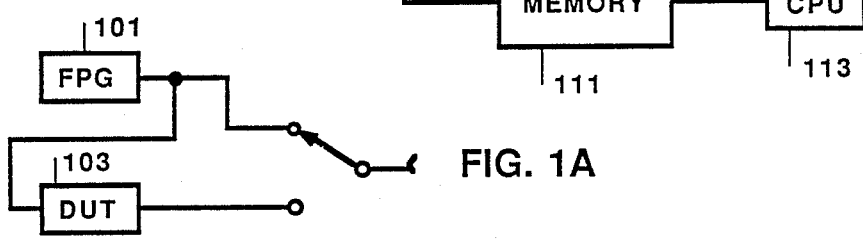
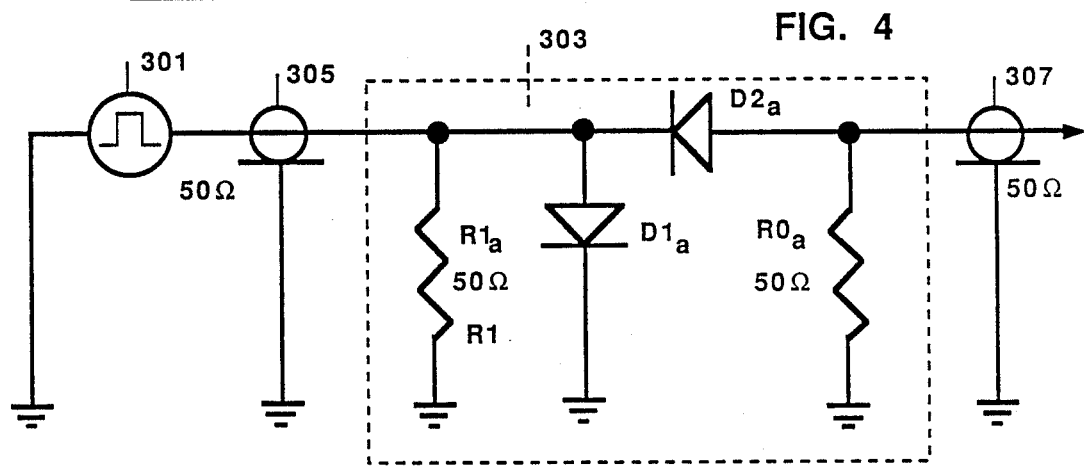
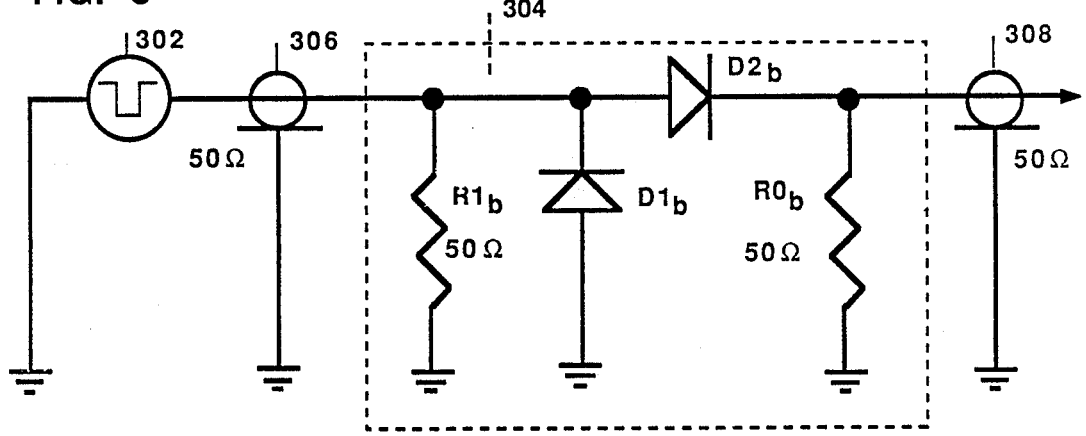

METHOD AND APPARATUS FOR MEASURING SETTLING CHARACTERISTICS OF A DEVICE UNDER TEST BY USING A MEASUREMENT SYSTEM FOR MEASURING AN INPUT SIGNAL BY SAMPLING AND DIGITIZING SAID INPUT SIGNAL

This invention relates to a method and an apparatus for accurately measuring settling characteristics.

BACKGROUND OF THE INVENTION

On evaluating the dynamic characteristics of an amplifier or the like, its settling characteristics, such as the settling time of its step response, are important.

In the prior art, measurement of the settling characteristics is done by directly observing the output signal of the "device under test" (or DUT), with an oscilloscope, a high speed digitizer, or the like. In order to avoid degradation of the performance of the measurement system, caused by saturation of the input amplifier of the oscilloscope used for the measurement, some measurement systems have employed a differential analog operation. An example of such a measurement method is described by the article entitled "Settling-time measurements demand precise test circuitry," by Jim Williams, EDN Nov. 15, 1984.

When highly accurate settling characteristics measurement is attempted by such a method, measurement error is introduced from the transmission characteristics of the transmission line connected from the device under test or DUT and the characteristics of the differential amplifier With respect to the waveform distortion caused by the transmission characteristics of the transmission line, see, for example, page 206 of Electronics Series 44, "Pulse Measurement and Its Applications" published by Sampou Co. Ltd. in Japan. It is quite difficult not only to compensate for this distortion but also to evaluate the distortion quantitatively. It is also difficult to obtain an amplifier having performance good enough to be used for the measurement system for the settling characteristics.

Furthermore, when the measurement data is obtained by sampling and digitizing the output signal of a DUT, the cables, probe amplifier, and sampler introduce error. Though such an error component, which is caused by the cable and probe amplifier, could be eliminated by connecting the output of the DUT directly to the sampler without any intermediate devices, the error caused by the sampler would still remain. In addition, because such an arrangement of connections is often impossible, in view of the construction of the measurement system, the full arrangement would lose universality.

A major object of the present invention is to provide a novel method for measuring settling characteristics with high accuracy and without the drawbacks of the prior art.

SUMMARY OF THE INVENTION

In accordance with a preferred embodiment of the present invention, a method for measuring settling characteristics is provided in which the error component due to the measurement system itself is compensated by using a pulse generator which generates a substantially ideal waveform.

In this new method, the output signal from the DUT is recorded after sampling and digitizing. Such data not only show the settling behavior of the DUT, but are also overlapped with the error component due to the settling characteristics of the measurement system. Independent of the measurement of the DUT output, reference data are obtained by observing and digitizing with the measurement system a pulse which has a substantially ideal waveform and is directly given to the measurement system. The ideal waveform, as mentioned above, is, in practice, a waveform in which at least one of its levels is flat.

In order to eliminate the error component of interest, the present embodiment at first determines a reference point of predetermined characteristics for each of the measurement data for the DUT and the reference data, and then adjusts the timing between these two reference points. Level adjustment between the measurement data and the reference data is performed. The level adjustment is done for both gain and offset between the levels of these data. The reference data that have been adjusted to the measurement data for the timing and the level are then subtracted from the measurement above, the waveform data then representing the true characteristics of the output signal of the DUT.

BRIEF DESCRIPTION OF THE DRAWINGS

FIG. 1 is a block diagram of an arrangement embodying the principles of the invention for implementing the method of the invention for measuring the settling characteristics of a device under test or DUT.

FIG. 1A is an alternative connection for the FPG and the DUT of FIG. 1.

FIG. 4 is an example of a circuit configuration of the FPG for generating the pulse form used in FIG. 2.

FIG. 5 is a similar view of a circuit configuration of the FPG for generally the pulse form used in FIG. 3.

DESCRIPTION OF A PREFERRED EMBODIMENT OF THE INVENTION

FIG. 1 is a block diagram showing one example of an arrangement to implement the method for measuring settling characteristics in accordance with one embodiment of the present invention. In FIG. 1 the input of the measurement system 100 is selectively provided with the outputs of a flat pulse generator 101 (hereinafter referred to as FPG 101) and a device under test 103, the settling characteristics of which are to be measured (hereinafter referred to as DUT 103). The FPG 101 is a pulse generator for generating a pulse, one of its two amplitude levels being very flat.

The DUT 103 may be anything whose settling characteristics are to be measured, such as an amplifier, a digital-analog converter, a cable, a relay or the like.

When the PPG 101 is used, the pulse generator generates a pulse in which either the high level or the low level is flat; in other words, its settling time is zero and after having settled, it keeps its constant level for any desired length of pulse duration. Of course, both of the levels may be flat.

Figure 2:
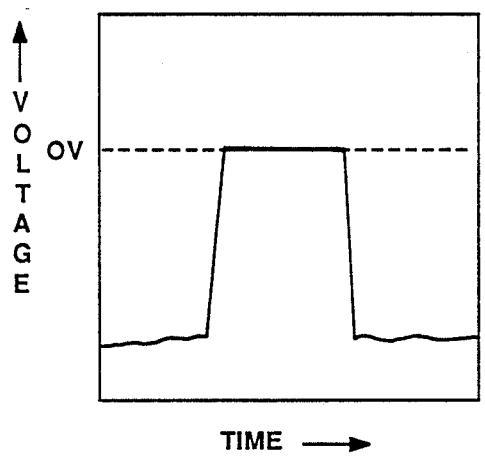
FIG. 2 is an example of a waveform of the pulse for providing the reference data in which the upper level of the pulse is flat.
Figure 3:
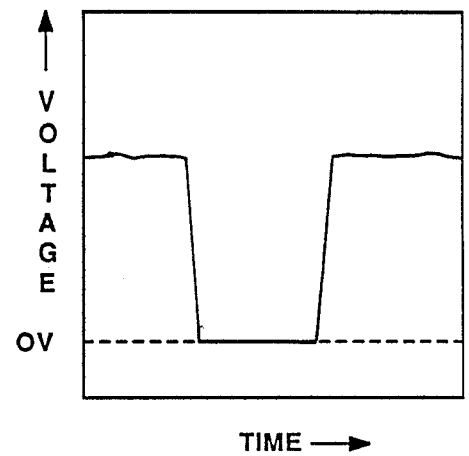
FIG. 3 is an example of a pulse waveform for the reference date in which the lower level is flat.

Examples of such pulses are shown in FIGS. 2 and 3, and respective examples of circuits for generating such pulses are shown in FIGS. 4 and 5. In the exemplified circuits shown in FIGS. 4 and 5 the outputs of a pulse generator 301 (FIG. 4) or 302 (FIG. 5), which do not necessarily have an ideal waveform, are shaped by a shaping circuit 303 (FIG. 4) or 304 (FIG. 5). The shaping circuits 303 and 304 comprise Schottky barrier diodes $D1_a$ and $D2_a$ (FIG. 4) or $D1_b$ and $D2_b$ (FIG. 5), which operate at high speed. The shaping circuits 303 and 304 further include terminal resistors $R1_a$ and $R0_a$, or $R1_b$ and $R0_b$. The respective terminal resistors $R0_a$ and $R0_b$ are located at the output side and prevent the reflection at the output side of their respective shaping circuits 303 or 304, which would otherwise happen when Schottky barrier diodes $D2_a$ or $D2_b$ are turned off.

The pulse generator 301 or 302 is connected to its respective shaping circuit 303 or 304 by a transmission line, such as the center conductor of a coaxial cable 305 or 306, the outer conductor thereof being grounded. The output from the shaping circuit 303 or 304 passes through a transmission line, such as the center conductor of a coaxial conductor 307 or 308, the outer conductor being grounded. Each of the transmission lines 305, 306, 307, and 308 may have a characteristic impedance of fifty ohms. The dispositions and values of the resistors $R1_a$, $R2_a$, $R1_b$ and $R2_b$ and the dispositions of the diodes $D1_a$, $D2_a$, $D1_b$ and $D2_b$ may be as shown in FIGS. 4 and 5.

For example, the pulse output from the generator 301 in FIG. 4 is selected such that the high voltage level of the pulse is higher than the forward voltage of the Schottky barrier diode D2a, and the lower voltage level of the pulse is at a negative voltage. The output of the shaping circuit 303 is the pulse whose lower voltage level is at zero and is very flat. In order to prevent the degradation of the settling characteristics of this output signal that might be caused by the reflection on the output side, the output of the shaping circuit 303 is terminated with the characteristic impedance of the transmission line through which the output signal passes.

Returning to the operation of the arrangement in FIG. 1, the pulse of an almost ideal waveform generated by FPG 101 is first provided to the measurement system 100. This pulse is stored in a memory 111 in the form of a time sequence of digitized data, through a transmission line 105, a sampler 107, and a digitizer 109. This data sequence will be employed as the reference data.

The output signal of DUT 103 is next measured by the measurement system 100 in the similar manner to the measurement of the output of the FPG 101 and the result is stored in the memory 111 in the form of a time sequence of digitized data. This data sequence will be employed as the measurement data.

In case the DUT 103 is an amplifier, a cable, or the like, the FPG 101 and the DUT 103 may be connected as shown in FIG. 1A.

With the measurement data and the reference data obtained as above, compensation of the measurement data is effected as described below, presuming that the output signal of the FPG 101 has an ideal waveform.

Because the measurement data and te reference data are in general different both in timing and as to voltage level, adjustment must be made for both of these factors. The amount and type of adjustment may be determined, for example, as described below.

Figure 6:
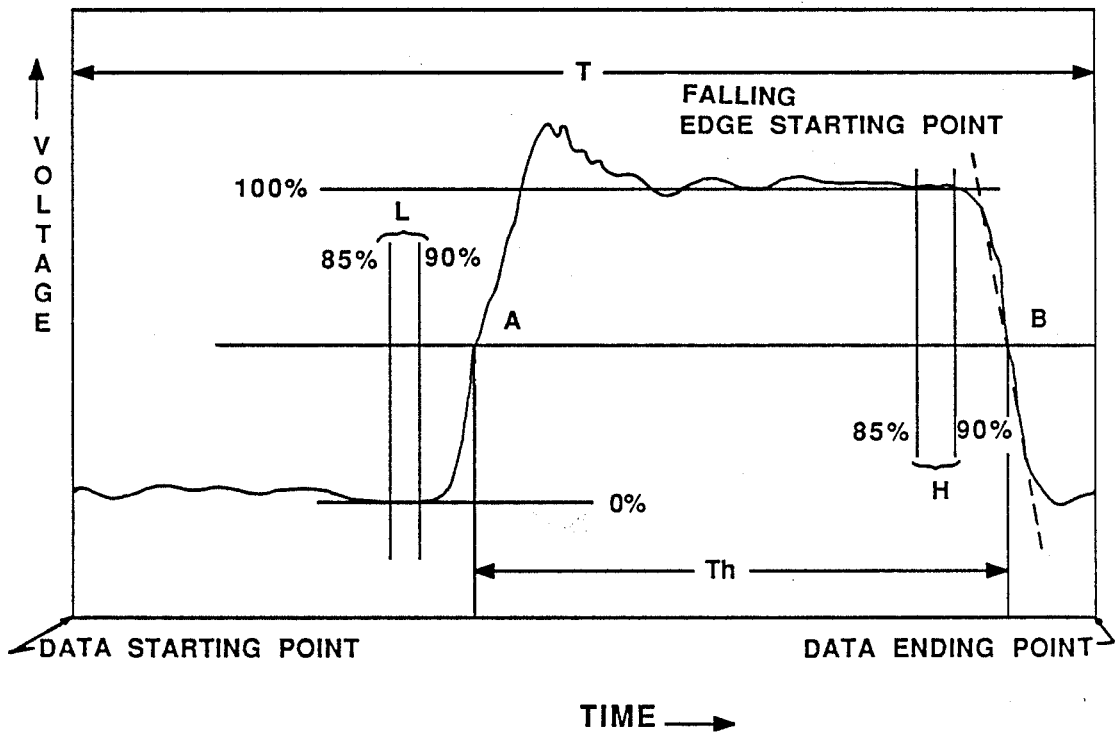
FIG. 6 is a diagram for explaining the timing adjustment and the level adjustment between the measurement date, and the reference data.

First, reference points A and B, each on the 50% level, are determined for each of the respective reference data and measurement data, as shown in FIG. 6. The 100% level is defined as the average of the voltage level, over interval H (hereinafter referred to as upper average), interval H being 85-90% of Th after the time of the reference point A (the time between the reference points A and B being defined as Th). Similarly, 0% level is defined as the average of the level over interval L (hereinafter referred to as lower average), interval L being 85-90% of a value TL (=T−Th) after reference point B (the data ending point wraps to the data starting point).

The reference points A and B are determined when the points A and B are at the 50% voltage level, which is calculated from the 0% and 100% voltage levels obtained according to the above-described procedure. In the explanation below, the reference points A and B of the measurement data are denoted as Am and Bm, those of the reference data being denoted as Ar and Br (See FIG. 7).

One might regard these definitions as circular, since the intervals for determining the 100% and 0% voltage levels are, in turn, determined using the time from the 50% points A and B which are actually to be determined. In reality, however, these points can be determined with close approximation. For example, once the minimum and maximum voltages measured are tentatively determined respectively as the 0% and 100% voltage levels, then the voltage of the 50% voltage level can tentatively be determined. With this tentative 50% voltage level, the 0% and 100% voltage levels can be calculated from the intervals determined in accordance with the above definitions. These levels, in turn, produce the next approximation, or a more accurate 50% voltage level. If the measured waveform settles sufficiently quickly, this 50% voltage level can be regarded as practically correct. Otherwise the above procedure may be repeated.

Next, a gain coefficient G is determined as follows:

$$G = [(\text{upper average of reference data}) - (\text{lower average of reference data})] / [(\text{upper average of measurement data}) - (\text{lower average of the measurement data})].$$

Then coefficient $OF_u$ and $OF_1$ are determined, depending on whether the settling characteristic of the upper or lower voltage levels are to be used, as follows:

(a) for measurement of the settling characteristics of the upper level:

$OF_u$=(upper average of the measurement data)−(upper average of the reference data);

(b) for measurement of the settling characteristics of the lower level:

$OF_1$=(lower average of the measurement data)−(lower average of the reference data).

With the coefficients G and OF obtained as above, a difference Cal(n) between the measurement data and the reference data is obtained as follows:

Cal(n) = −OF + (measurement data(n)) − (reference data(n)) / G, wherein OF is one of $OF_u$ and $OF_1$, depending on which level is to be used.

The factors (measurement data(n)) and (reference data(n)), respectively, represent data points of the measurement data and the reference data with the index n, counting respectively from the reference points Am and Ar. In addition, when the indexed data point reaches the data ending point in FIG. 6, the next indexed point wraps to the data starting point.

With the above procedure, the timings of the measurement data and the reference data are adjusted by causing the reference points Am and Ar to occur at the same time; the level adjustment is made for both of the gain and the offset.

The value of Cal(n), obtained as described above does not represent the true waveform itself that could be obtained by subtracting the error component due to the settling characteristics of the measurement system from the measurement data, but what it actually represents is how far the measurement data deviates from the ideal waveform. This is satisfactory so long as the measurement data is to be evaluated over this difference. If the settling waveform itself is required, a pulse of the ideal waveform should be added to Cal.

Figure 7:
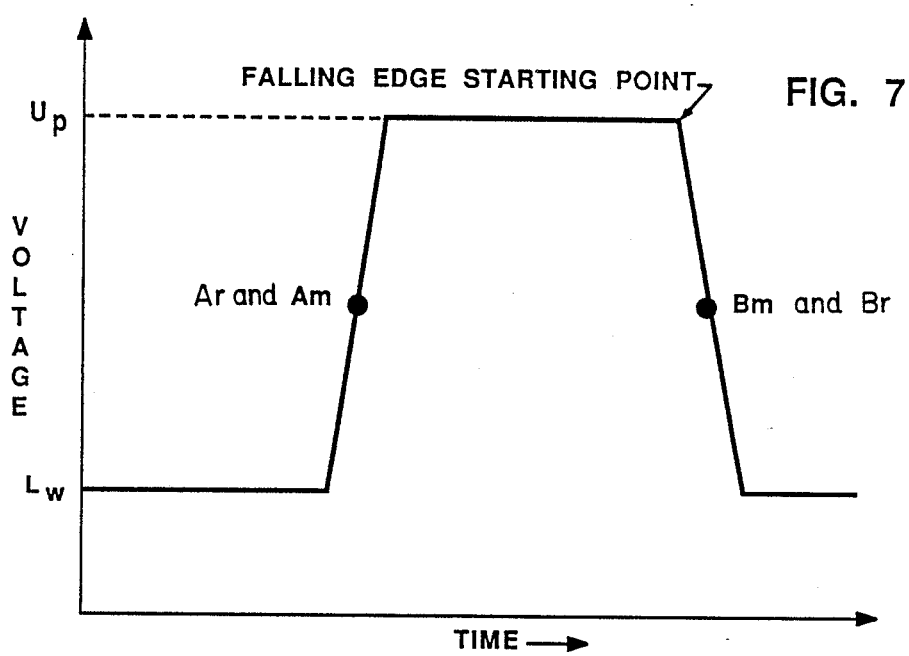
FIG. 7 is a diagram illustrating one method for determining the waveform of the ideal pulse used for the compensation.

Data P(n) representing the pulse of this ideal waveform can be determined as shown in FIG. 7.

First, reference point A of the measurement data Am (the point of the 50% voltage level) is used as a reference, that is:

p(O) = $(U_p + L_w)/2$ wherein $U_p$ and $L_w$ are the upper and lower averages of the measurement data, respectively. The "0+ in P(O) is zero.

For the rising edge portion, P(n)'s are determined as below:

P(n) = Sr × (T/N) × n + P(O), (1)

wherein N is the number of all of the data points, and Sr is the slew rate of the rising edge of the measurement data.

Expression (1) is applied to the data points around the reference point Am within the range in which the calculated value of P(n) will lie between the lower average $L_w$ and the upper average $U_p$.

After the value of P(n) reaches $U_p$ and until P(n) reaches the falling edge starting point, P(n) is determined as below:

P(n) = $U_p$ wherein the falling edge starting point may be defined, as, for example, the intersecting point of the horizontal line of the value $U_p$, and a line F passing through the reference point of the falling edge Bm with a gradient of Sf which is the slew rate of the falling edge of the measurement data.

In the above procedure, the slew rates of the rising and falling edges Sr and Sf may be defined by, for example, the gradients of the lines between the points of 20% and 80% voltage levels in FIG. 6.

Within the range from the falling edge starting point until the value of the point reaches the lower average $L_w$, the P(n)'s are determined to be on line F as explained above.

After this point and until the rising edge starting point (remember the data ending point wraps to the data starting point), P(n) = $L_w$.

By adding the value of the ideal pulse P(n) obtained as above to Cal(n), the waveform is obtained which is the measurement data whose error component due to the settling characteristics of measurement system 100 itself, has been eliminated.

In the above procedure, generating the reference pulse with the FPG 101, whose rising and falling speeds are substantially the same as those of the output signal of the DUT 103, will bring a compensation of less residual error.

Needless to say, the present invention is not limited to the specific embodiment described as above.

Figure 8:
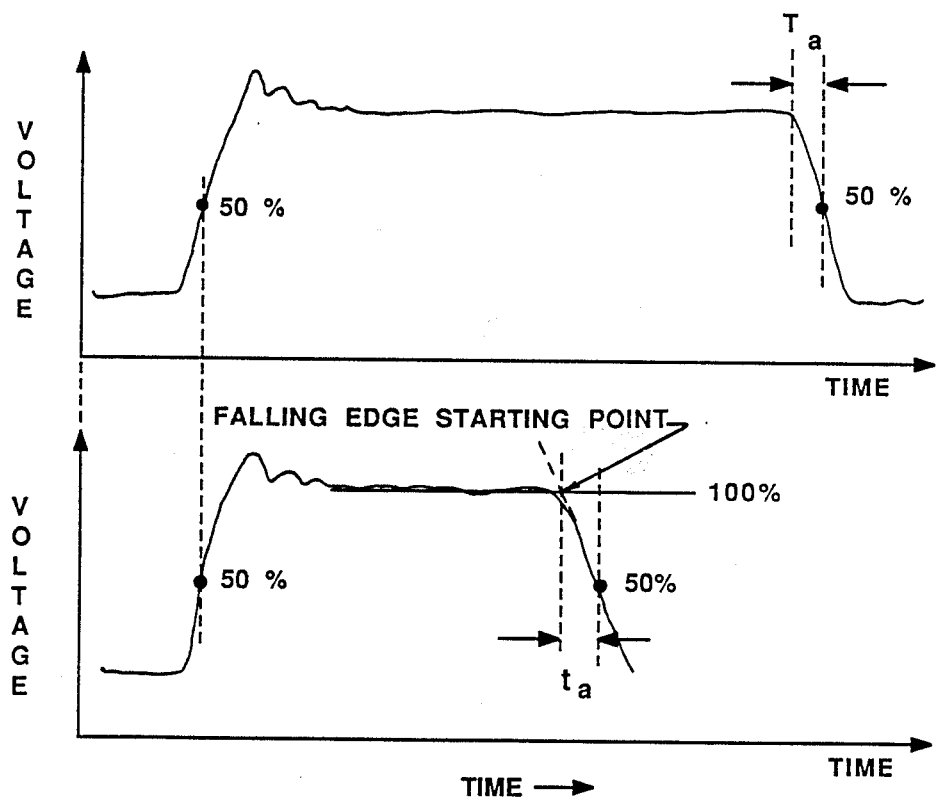
FIG. 8 is a diagram showing one example of the method for performing the compensation when the duties of the measurement data and the reference data are different.

For example, the above embodiment assumes that the durations (i.e., the length of the portion of the waveform which is to be flat, e.g., the length, or time Th of the portion from the reference point A to the reference point B in FIG. 6) of the measurement data and the reference data are equal; in case this assumption does not apply, the compensation would become faulty after the point where one of them comes to the falling edge stating point. This problem can be solved, for example, as shown in FIG. 8. That is, first, the duration of the reference data is selected to be longer than that of the measurement data. Then, until a predetermined point is reached, compensation is carried out in a manner similar to the one described above, in which the "predetermined point" may be defined, for example, as the falling edge starting point. With respect to the portion after the falling edge starting point, the data for reference are the portion of the reference data starting at a point that is found by tracing back from the 50% level point of the falling edge of the reference data by Ta (the time from the falling edge to the 50% level point).

When the polarity of the measurement data is opposite to that in the above explanation and the settling characteristics of the lower level side are to be determined, it is clear that the same compensation can also be made.

Furthermore, it is possible to perform the measurement on both of the upper and lower levels. To do this, it is sufficient to have the reference data for each of upper and lower levels. In addition, the crossing point of these two references is set to be at the 50% level, using the reference data having the flat upper level for the level greater than the 50% level, and using the reference data having the flat lower level for the level smaller than the 50% level. When the compensation of the measurement system is sufficiently linear, one set of reference data can be used for the other reference by reversing its polarity.

When the measurement system acquires the data, the measurement may be repeated for CPU 113 to average the acquired data, as is usually done in this field. If the sampling rate for the reference data and that for the measurement data are different, an appropriate interpolation may be made before comparing them.

Though a number of the specific values of the ratios are indicated in FIG. 6, etc., other values may be employed for them. Furthermore, different procedure may be used instead of that described in FIG. 6 to execute the adjustment of the voltage level and the timing between the measurement data and reference data.

Further, instead of performing the compensation over the whole range of the measurement data, it is possible to determine how the output of DUT settles by performing the compensation only over the portion that is important for the measurement of the settling characteristics, for example, in FIG. 6, over the portion starting around the reference point A for a required time.

Further, with respect to the sequence of obtaining the measurement data and the reference data, either one may be obtained earlier. In addition, in case the configuration of the measurement system is fixed and the environment of the system, including the temperature and humidity, is kept constant, then i is not necessary to re-obtain the reference data frequently.

Though the ideal waveform is added after the adjustment of the voltage level and the timing has been finished in the above embodiment, this sequence can freely be changed. For example, data for the compensation to cancel the error component in the measurement data due to the settling characteristics of the measurement system itself may first be calculated by using the measurement data and the reference data, and then the true waveform of the signal to be measured may be reproduced from the data for the compensation and the measurement data.

Further, with respect to the means for generating the reference signal, it is not limited to what is indicated in the embodiment; it may be whatever an generate the desired reference waveform.

As has been explained in detail, the present invention has the novel advantage in that, on measuring the settling characteristics or the like, it is possible to eliminate almost completely the error introduced by the measurement system itself.

To those skilled in the art to which this invention relates, many changes in construction and widely differing embodiments and applications of the invention will suggest themselves without departing from the spirit and scope of the invention. The disclosures and the descriptions herein are purely illustrative and are not intended to be in any sense limiting.

What is claimed is:

1. Method for measuring settling characteristics of a device under test by using a measurement system for measuring an input signal by sampling and digitizing said input signal, comprising the steps of:
   measuring and digitizing reference data by measuring a reference signal, at least one level of which is of substantially constant value,
   measuring and digitizing measurement data by measuring a second signal representing the settling characteristics to be measured but containing an error component due to inclusion of said measurement system itself, and
   removing said error component from said measurement data by adjusting the timing and level of said reference data relative to those of said measurement data.

2. Method for measuring the settling characteristics of a device under test by using a measurement system for measuring an input signal by sampling and digitizing said input signal, comprising the steps of:
   measuring and digitizing reference data from a pulse generator by measuring a reference signal from said pulse generator, at least one voltage level of said reference signal being of substantially constant value,
   measuring and digitizing measurement data from said device under test by measuring a second signal representing the settling characteristics to be measured by containing an error component due to inclusion of said measurement system itself, and
   removing said error component from said measurement data by adjusting the timing and voltage level of said reference data relative to those of said measurement data.

3. The method of claim 2 comprising processing the reference data and the measurement data separately from each other and sending these data separately from each other to a central processing unit serially via a transmission line, a sampler, a digitizer, and a memory.

4. The method of claim 2, comprising deriving said reference data from a pulse generator by shaping a thereby generated pulse through a shaping circuit comprising a pair of Schottky barrier diodes, one of said diodes being shunted to ground, the other one being in series with said pulse generator and having an output, and a pair of grounded terminal resistors, one in parallel with each said diode.

5. The method of claim 2 wherein the step of removing the error component includes:
   determining reference points Ar and Br for the reference data and Am and Bm for the measurement data, each said reference point being at 50% voltage level between an upper average treated as 100% voltage level and a lower average treated as 0% voltage level,
   said upper averages of the reference data and of the measurement data being determined during 85 to 90% of the time $T_h$ from the point Ar to the point Br and from the point Am to the point Bm, respectively, said lower averages of the reference data and of the measurement data being determined during 85 to 90% of the time $T_L \cong (T - T_h)$ from the point Br to the next point Ar and from the point Bm to the next point Am respectively,
   determining a gain coefficient G as the difference between the upper average of the reference data and the lower average of the reference data divided by the difference between the upper average of the measurement data and the lower average of the measurement data,
   determining coefficient $OF_u$ and $OF_1$,
   (a) for measurement of the settling characteristics of the upper level, as $OF_u$ = the upper average of the measurement data minus the upper average of the reference data, and
   (b) for measurement of the settling characteristics of the lower level as $OF_1$ = the lower average of the measurement data minus the lower average of the reference data,
   determining a difference Cal(n) between the measurement data and the reference data as Cal(n) = −OF + (measurement data(n)) - reference data(n) divided by G, wherein OF is one of $OF_1$ and $OF_u$, the measurement data(n) representing data points of the measurement data with the index n counting from the reference point Am, the reference data(n) representing data points of the reference data with the index n counting from the reference point Ar.

6. The method of claim 1 comprising adjusting the timings of the measurement data and the reference data by having the reference points Am and Ar occur at the same relative time.

7. The method of claim 5 when $T_h$ is approximately equal to $T-T_h$ wherein Cal(n) is computed by adding to it a pulse P(n) of an ideal waveform, wherein
$P(O)=(U_p+L_w)/2$, where the "0" in P(O) is zero,
$U_p =$ the upper average of the measurement data and
$L_w =$ the lower average of the measurement data,
  (1) from the point $L_w$ to the point $U_p$, any point $P(n)=S_r \times (T/N) \times N + P(O)$, N= the number of all the data point employed, $S_r=$ the slew rate of the rising edge of the measurement data,
  (2) between $U_p$ and the falling edge starting point, $P(n)=U_p$,
  (3) between the falling edge starting point and $L_w$, $P(n)=(S_f) \times (T/N) \times n + P(O)$, when $S_f=$ the slew rate of the falling edge of the measurement data, and
  (4) between $L_w$ and the rising edge starting point, $P(n)=L_w$.

8. The method of claim 5 in cases in which the duration of the reference data is substantially different from the duration of the measurement data,
determining the falling edge of the reference data for its 100% voltage level, and
then determining the time duration between said trailing falling edge to the 50% voltage level of said reference data.

9. The method of claim 5 in cases in which the duration of the reference data is substantially different from the duration of the measurement data,
determining the trailing rising edge of the reference data from its 0% voltage level, and
then determining the time duration between said 50% voltage level of said reference data and said rising edge.

10. The method of claim 2 where, in addition there are the steps of
determining the falling edge of the reference data for its 100% voltage level, and
then determining the time duration between said falling edge to the 50% voltage level of said reference data.

11. Apparatus for measuring settling characteristics of a device under test, comprising
input means for providing an input signal,
a measurement system for measuring an input signal by sampling and digitizing said input,
reference means for providing a reference signal, at least one level of which is of substantially constant value, and for obtaining therefrom reference data,
measuring means for obtaining signal representing the settling characteristics of a device under test and also containing an error component due to inclusion of said measurement system and for providing measurement data, and
adjusting means for adjusting the timing and voltage level of said reference data relative to those of said measurement data.

12. Apparatus for measuring settling characteristics of a device under test, comprising
pulse generator means for providing a reference signal, at least one level of is of substantially constant value, and for obtaining therefrom reference data,
a switch connected to said device under test at a first pole and to said pulse generator at a second pole, an arm for alternate connection of said poles,
a measuring system connected to said switch arm and having
measuring means for obtaining a signal representing the settling characteristics of said device under test, said signal also containing an error component due to inclusion of said measurement system and for providing measurement data, and
adjusting means for adjusting the timing and voltage level of said reference data relative to those of said measurement data.

13. The apparatus of claim 12 wherein said measurement system comprises, in series, a transmission line, a sampler, a digitizer, a memory, and a central processing unit.

14. The apparatus of claim 12 wherein said reference data is from a pulse generator by a shaping circuit comprising a pair of Schottky barrier diodes, one of said diodes being shunted to ground, the other one being series connected to said pulse generator and having an output, and a pair of grounded terminal resistors, one in parallel with each said dioded.

15. The apparatus of claim 12 wherein said first pole is connected to both said device under test and said pulse generator.

* * * * *

UNITED STATES PATENT AND TRADEMARK OFFICE
CERTIFICATE OF CORRECTION

PATENT NO. : 4,833,403

DATED : May 23, 1989

INVENTOR(S) : Toshio Tamamura; Akira Hoshika; Kiyoyasu Hiwada

It is certified that error appears in the above-identified patent and that said Letters Patent is hereby corrected as shown below:

Column 1, line 33, "amplifier With" should read -- amplifier. With --

Column 2, line 43, "ment data, and" should read -- ment data and --

Column 2, line 67, "PPG" should read -- FPG --

Column 3, line 67, "and te" should read -- and the --

Column 5, line 41, "The "0+ in P(O)  should read -- The "O" in P(O) --

Column 7, line 19, "then i is" should read -- then it is --

Column 7, line 34, "whatever an" should read -- whatever can --

Column 10, line 45 "said dioded." should read -- said diode. --

Signed and Sealed this

Sixth Day of March, 1990

Attest:

JEFFREY M. SAMUELS

*Attesting Officer*                    Acting Commissioner of Patents and Trademarks